(12) United States Patent
Cho et al.

(10) Patent No.: US 8,791,400 B2
(45) Date of Patent: Jul. 29, 2014

(54) STORING DATA IN DUMMY PIXELS IN AN IMAGE SENSOR

(75) Inventors: Kwang Jun Cho, Seoul (KR); Tae Woo Kim, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 422 days.

(21) Appl. No.: 13/159,540

(22) Filed: Jun. 14, 2011

(65) Prior Publication Data

US 2011/0315853 A1    Dec. 29, 2011

(30) Foreign Application Priority Data

Jun. 25, 2010  (KR) .................. 10-2010-0060538

(51) Int. Cl.
*H01L 27/146* (2006.01)

(52) U.S. Cl.
USPC ....................................... 250/208.1

(58) Field of Classification Search
USPC ......... 250/208.1, 214.1; 348/222.1, 245–247, 348/308
See application file for complete search history.

(56) References Cited

U.S. PATENT DOCUMENTS

| 7,586,076 B2 * | 9/2009 | Silsby ................... 250/208.1 |
| 8,456,885 B2 * | 6/2013 | Tolmie et al. .............. 365/115 |
| 2002/0163491 A1 * | 11/2002 | Yoshimura et al. ............ 345/90 |

FOREIGN PATENT DOCUMENTS

| JP | 2008-271280 | 11/2008 |
| KR | 1020020057251 A | 7/2002 |

* cited by examiner

*Primary Examiner* — Seung C Sohn
(74) *Attorney, Agent, or Firm* — William Park & Associates Patent Ltd.

(57) ABSTRACT

An image sensor includes a dummy pixel array with at least one dummy pixel, a pixel array with a plurality of main pixels, and a data processing unit configured to process a signal provided from the main pixels. The dummy pixel includes: a first switch having a first terminal receiving a first voltage and a second terminal coupled to a floating node; a second switch having a first terminal receiving a second voltage; a third switch coupled between a second terminal of the second switch and the floating node; and a driving element configured to drive a first terminal thereof according to a voltage level applied to the floating node.

8 Claims, 8 Drawing Sheets

(a)

(b)

(a)

(b)

(a)

(b)

STORING DATA IN DUMMY PIXELS IN AN IMAGE SENSOR

CROSS-REFERENCE(S) TO RELATED APPLICATIONS

The present application claims priority of Korean Patent Application No. 10-2010-0060538, filed on Jun. 25, 2010, which is incorporated herein by reference in its entirety.

BACKGROUND OF THE INVENTION

Exemplary embodiments of the present invention relate to an integrated circuit, and more particularly, to an image sensor.

In general, an image sensor refers to a device which captures an image by using semiconductor properties that respond to light. Each part of a subject present in the natural world differs in brightness and wavelength of light. Thus, each pixel of a sensor exhibits a different electrical value. An image sensor converts the electrical value into a level at which signal processing is possible. To this end, an image sensor is configured with dozens to hundreds of thousands of unit pixel arrays, an A/D converter converting an analog voltage into a digital voltage, and a memory.

SUMMARY OF THE INVENTION

An embodiment of the present invention is directed to an image sensor which can use a dummy pixel array as a mask read-only memory (ROM) to thereby effectively store operation codes of the image sensor.

In accordance with an embodiment of the present invention, a dummy pixel in an image sensor includes a first transistor having a first terminal receiving a first voltage and a second terminal coupled to a floating node, a second transistor having a first terminal receiving a second voltage, a switch coupled between a second terminal of the second transistor and the floating node, a driving transistor configured to drive a voltage at its first terminal to its second terminal according to a voltage level applied to the floating node, and a select transistor configured to communicate the voltage at the second terminal of the driving transistor as an output of the dummy pixel.

Different data may be stored according to a turned-on or turned-off state of the switch. That is, a "1" or a "0" may be stored in the dummy pixel by controlling the switch.

The image sensor may further include a photodiode coupled to the first terminal of the first switch.

The first voltage may be a voltage which turns on the driving element so that a voltage applied to a second terminal of the driving element is transferred to the first terminal of the driving element.

In this case, the first voltage may be a power supply voltage, and the second voltage may be a ground voltage.

The first voltage may be a voltage which does not turn on the driving element.

In this case, the first voltage may be a ground voltage, and the second voltage may be a power supply voltage.

The dummy pixel may be configured in a 4 T pixel structure.

In accordance with another embodiment of the present invention, a method for storing data in a dummy pixel in an image sensor includes storing data by turning on or off a first switch of the dummy pixel coupled to a floating node, providing a precharge voltage to the floating node by turning on a second switch of the dummy pixel, turning on a third switch of the dummy pixel coupled to the first switch, and discharging or sustaining a precharge voltage precharged at the floating node according to the turn-on or turn-off of the first switch; and performing a driving operation according to a voltage level of the floating node.

The precharge voltage may be a ground voltage or a power supply voltage.

DESCRIPTION OF SPECIFIC EMBODIMENTS

Figure 1:
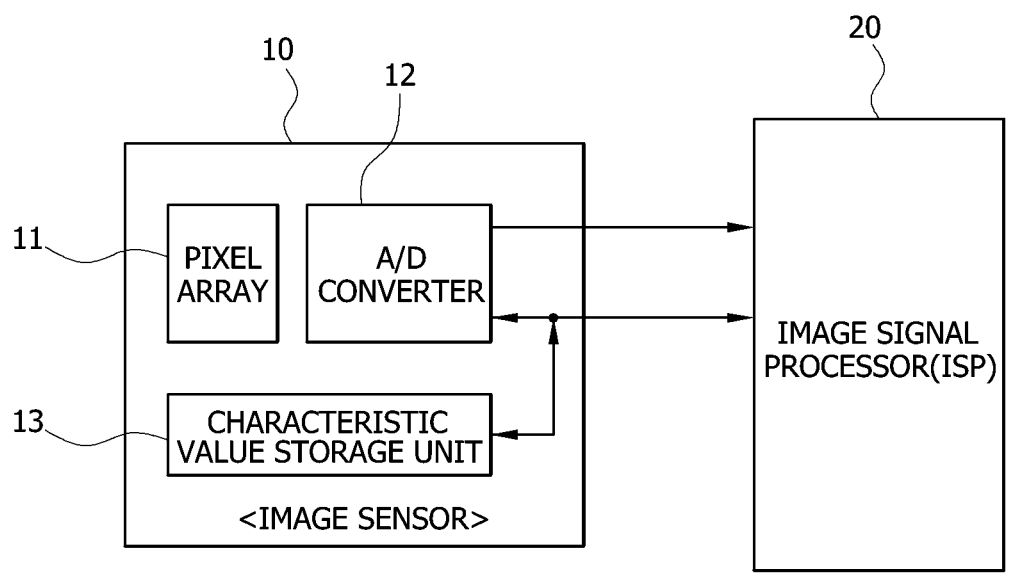
FIG. 1 is a block diagram of a CMOS image sensor.

Exemplary embodiments of the present invention will be described below in more detail with reference to the accompanying drawings. The present invention may, however, be embodied in different forms and should not be constructed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram of a CMOS image sensor, which is presented for purpose of explanation of the present invention.

Referring to FIG. 1, an image sensor 10 converts an optical image received through a lens into an image signal and transfers the image signal to an image signal processor (ISP) 20. The ISP 20 controls a camera module to correct the received image signal in order to improve image quality.

The performance of the image sensor 10 is determined by sensing parameters, such as image level, phase, shading, and contrast. In general, the performance of the image sensor 10 has different characteristic values due to a practical fabrication process. That is, under a situation which requires high pixel density and high image quality, the performance of the image sensor is considerably influenced by characteristic deviation of a lens, a sensor, an actuator, and so on, which constitute the camera module. Performance deviation (deviation of characteristic values) of the image sensors tends to be distributed in a wide range.

Therefore, a test operation is performed to verify whether the characteristic value of the completed image sensor falls within a reference range. To this end, after the image sensor is coupled to a test system, an image is evaluated and a characteristic value is derived.

In order to store the characteristic value of the image sensor 10, a memory block such as a characteristic value storage unit 13 is separately provided within the image sensor 10. Examples of the characteristic value storage unit 13 include a mask ROM, an electrically erasable programmable read-only memory (EEPROM), and a flash memory.

Figure 2:
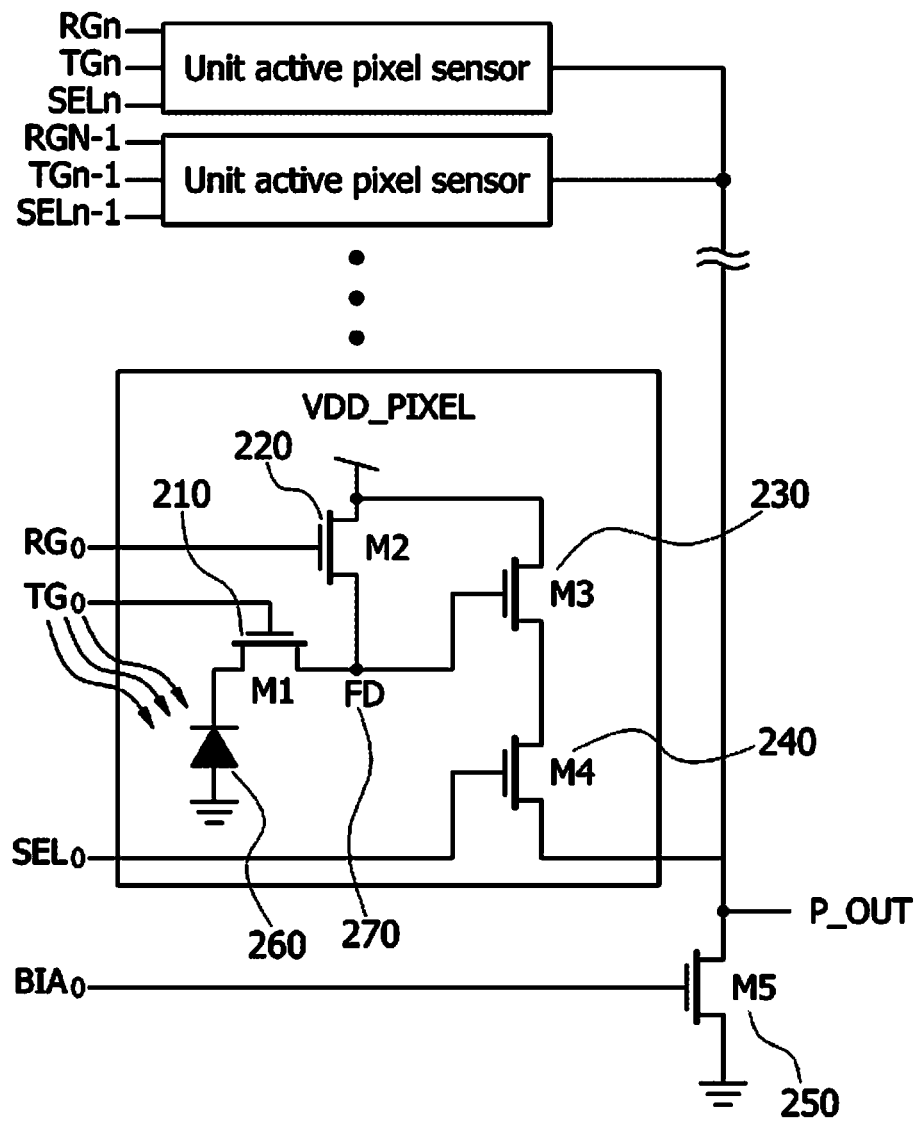
FIG. 2 is a configuration diagram illustrating a unit pixel of a typical CMOS image sensor.

FIG. 2 is a configuration diagram illustrating a unit pixel of a typical CMOS image sensor.

As illustrated in FIG. 2, a unit pixel includes four transistors 210, 220, 230, and 240 and one photodiode 260. Thus, such a unit pixel is called a 4 T structure. The photodiode 260 converts light energy into an electric signal by using a photoelectric phenomenon, and the four transistors 210, 220, 230, and 240 read the electric signal generated by the photodiode 260. Transistor 210 is a transfer transistor (Tx) which transfers the electric signal accumulated in the photodiode 260 to a terminal floating node 270. Transistor 220 is a reset transistor (Rx) which resets the terminal floating node 270 by connecting the terminal floating node 270 to a terminal VDD_PIXEL. Transistor 230 is a drive transistor (Dx) which acts as a source follower for driving a sample/hold circuit. Transistor 240 is a select transistor Sx which transfers an electric signal of a unit cell to an output terminal P_OUT which is a common signal line. Transistor 250 is a load transistor which serves as a current source. The transistor 250 may be shared by all unit active pixel sensors which are present at the same column.

The driving operation of the unit pixel will be described briefly with reference to FIG. 2.

When a reset signal RG is activated, the reset transistor 220 is turned on so that the terminal floating node 270 is coupled to the power supply voltage VDD_PIXEL and thus reset. At the same time, the drive transistor 230 is also turned on so that a voltage of VDD-VTH appears at the output terminal P_OUT. Thereafter, the reset signal RG is deactivated and thus the reset transistor 220 is turned off. When the transfer signal TG is activated, the transfer transistor 210 is turned on so that electrons accumulated in the photodiode 260 are transferred to the floating node 270. When the select transistor 240 is turned on, the signal transferred to the floating node 270 is transferred to the output terminal P_OUT through the drive transistor 230 and the load transistor 250.

Figure 3:
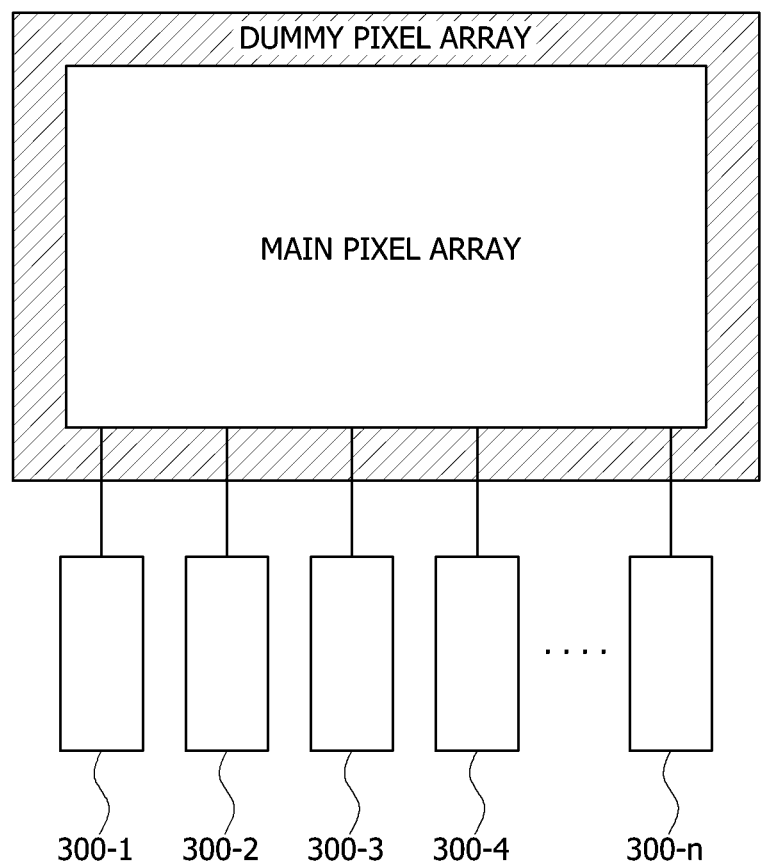
FIG. 3 is a configuration diagram illustrating a dummy pixel array of a CMOS image sensor.

FIG. 3 is a configuration diagram illustrating a dummy pixel array of a CMOS image sensor.

As illustrated in FIG. 3, the pixel array of the CMOS image sensor is divided into a main pixel array region and a dummy pixel array region. Pixels formed in a peripheral region of the pixel array region of the CMOS image sensor remain as the dummy pixel array region in order to reduce the influence caused by a edge effect occurring during a fabrication process and to prevent noise generated in a digital block adjacent to the pixel array from being transferred to the main pixel array region. Pixels present in the main pixel array region are coupled to column data processing units 300_1, 300_2, . . . , 300_n in lines, and pixels present in the dummy pixel array region are not coupled to the column data processing units 300_1, 300_2, . . . , 300_n. The column data processing units 300_1, 300_2, . . . , 300_n generate digital values corresponding to signals provided from the respective pixels, and transfer the digital values to a digital circuit block coupled to a subsequent stage. It is apparent that the column data processing units 300_1, 300_2, . . . , 300_n can transfer analog values corresponding to the signals provided from the respective pixels and a subsequent block can convert the analog values into digital values.

Figure 4:
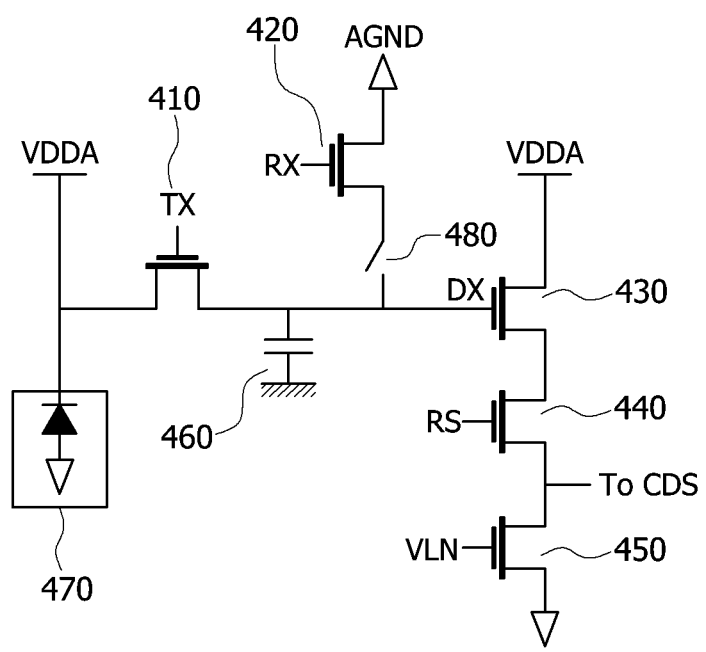
FIG. 4 is a circuit diagram illustrating a unit pixel of a dummy pixel array region in accordance with an embodiment of the present invention.

FIG. 4 is a circuit diagram illustrating a unit pixel of a dummy pixel array region in accordance with an embodiment of the present invention.

Referring to FIG. 4, the unit pixel of the dummy pixel array includes a photodiode 470 and four switching transistors in a 4 T structure, that is, a transfer transistor 410, a reset transistor 420, a drive transistor 430, and a select transistor 430, as in the case of FIG. 2. In addition, the unit pixel includes a switch 480 which is turned on/off to connect/disconnect the reset transistor 420. Furthermore, the drive transistor 430 and the select transistor 440 are provided in the unit pixel of the dummy pixel array. The clear transistor 450 may be used to clear the voltage at the node between the drive transistor 430 and the select transistor 440.

A first terminal of the transfer transistor 410 is supplied with a power supply voltage VDDA and is coupled to the photodiode 470. A first terminal of the reset transistor 420 is supplied with a ground voltage AGND, and a second terminal of the reset transistor 420 is coupled to the switch 480. The switch 480 is disposed between a floating node and the second terminal of the reset transistor 420. The switch 480 is turned on/off according to a data value that is to be stored.

By providing the additional switch 480 in the unit pixel of the dummy pixel array, data can be stored. Therefore, data corresponding to the number of pixels disposed in the dummy pixel array can be stored. When a digital value required to drive the CMOS image sensor is stored using the dummy pixel array, an additional memory block is not needed. Consequently, the CMOS image sensor can be implemented more effectively. The dummy pixel array may be used to store the characteristic value of the image sensor set forth in FIG. 1, or may be used to store the digital value required to drive the CMOS image sensor.

More specifically, when the digital code value is stored using the dummy pixel array, a digital code value for image signal processing can be stored, without increasing a chip size and adding a circuit. While the conventional art has required an additional memory region in order to store a digital code using a nonvolatile memory, such as a flash memory, an EEPROM, a Via ROM, or a mask ROM, the present invention can solve such a conventional problem.

Figure 5:
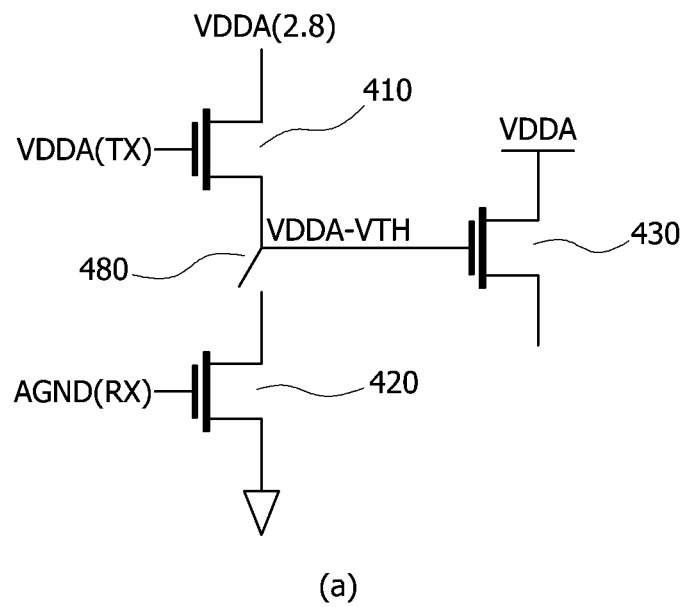
FIGS. 5 and 6 are circuit diagrams illustrating the operation of the unit pixel of the dummy pixel array in accordance with an embodiment of the present invention.
Figure 5:
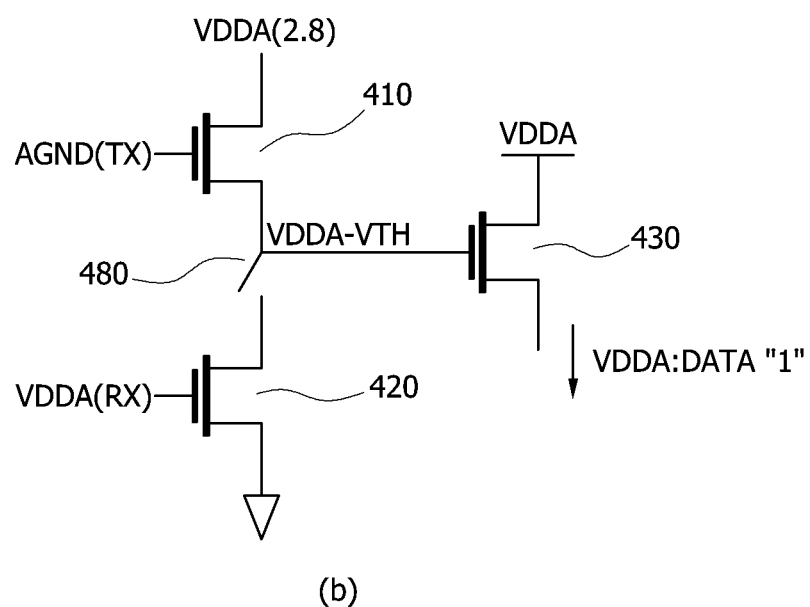
Figure 6:
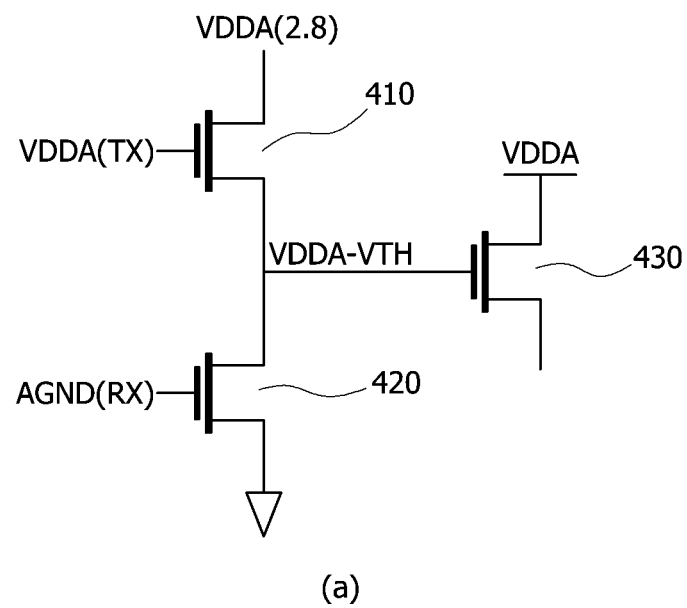
Figure 6:
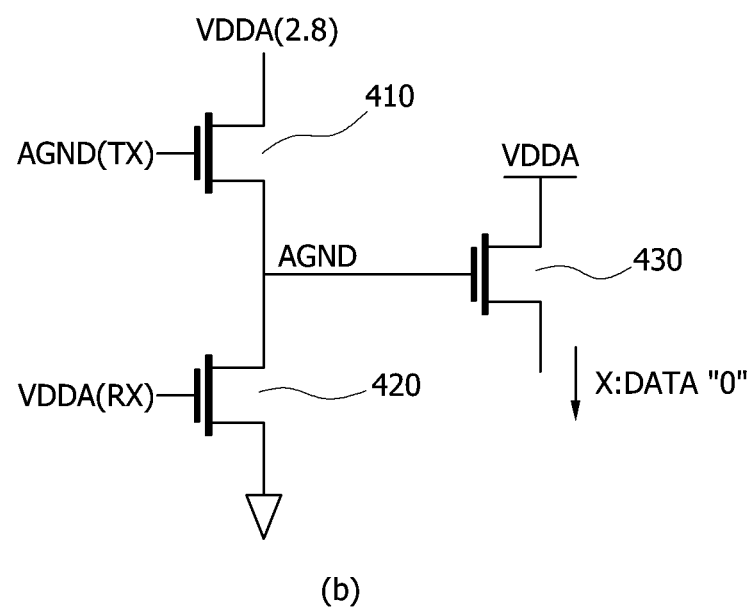

FIGS. 5 to 6 are circuit diagrams illustrating the operation of the unit pixel of the dummy pixel array in accordance with the embodiment of the present invention. Specifically, FIGS. 5 and 6 show how the unit pixel of the dummy pixel array operates as the data storage memory. FIG. 5 illustrates the operation on the unit pixel of the dummy pixel array which stores data "1", and FIG. 6 illustrates the operation of the unit pixel of the dummy pixel array which stores data "0".

As illustrated in FIGS. 5 and 6, when the switch provided in the unit pixel of the dummy pixel array is in a turned-off state, data "1" is stored. When the switch provided in the unit pixel of the dummy pixel array is in a turned-on state, data "0" is stored. The data "1" refers to a state in which the level of the power supply voltage VDDA is transferred to the drive transistor 430, and the data "0" refers to a state in which the level of the power supply voltage VDDA is not transferred to the drive transistor 430. In some cases, the voltage levels corresponding to the data "1" and the data "0" may be reversed.

FIG. 5(a) illustrates a precharge period for storing and outputting data "1", and FIG. 5(b) illustrates a read period. FIG. 6(a) illustrates a precharge period for storing and outputting data "0", and FIG. 6(b) illustrates a read period.

Referring to FIG. 5(a), the power supply voltage VDDA is applied to one terminal of the transfer transistor 410, and the ground voltage AGND is applied to one terminal of the reset transistor 420. In the precharge period, when the power supply voltage VDDA is applied to a gate terminal TX of the transfer transistor 410 and the ground voltage AGND is applied to a gate terminal RX of the reset transistor 420, the power supply voltage VDDA is charged in the floating node. That is, the power supply voltage VDDA is charged in the gate terminal of the drive transistor 430 coupled to the floating node.

Referring to FIG. 5(b), in the read period, when the ground voltage AGND is applied to the gate terminal TX of the transfer transistor 410 and the power supply voltage VDDA is applied to the gate terminal RX of the reset transistor 420, the power supply voltage VDDA is transferred through the drive transistor 430. This can be recognized as data "1". Although the reset transistor 420 is turned on in the read period, the floating node is not discharged because the switch 480 is in a turned-off state.

Referring to FIG. 6(a), the power supply voltage VDDA is applied to one terminal of the transfer transistor 410, and the ground voltage AGND is applied to one terminal of the reset transistor 420. In the precharge period, when the power supply voltage VDDA is applied to the gate terminal TX of the transfer transistor 410 and the ground voltage AGND is applied to the gate terminal RX of the reset transistor 420, the power supply voltage VDDA is charged in the floating node. That is, the power supply voltage VDDA is charged in the gate terminal of the drive transistor 430 coupled to the floating node. Referring to FIG. 6(b), in the read period, when the ground voltage AGND is applied to the gate terminal TX of the transfer transistor 410 and the power supply voltage VDDA is applied to the gate terminal RX of the reset transistor 420, the reset transistor 420 is turned on and the floating node is discharged. This is because the switch 480 is coupled, unlike in FIG. 5. Therefore, the drive transistor 430 is turned off, and the power supply voltage VDDA is not transferred. Consequently, this can be recognized as data "0".

Figure 7:
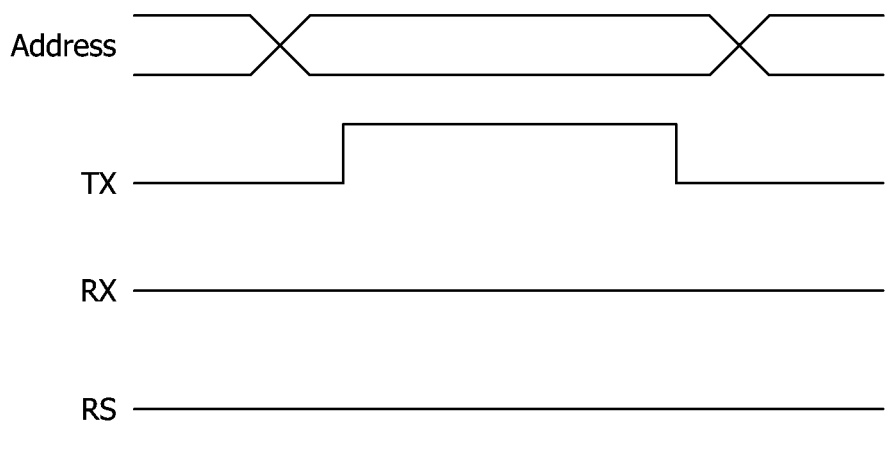
FIG. 7 is a timing diagram illustrating the operation of the unit pixel of the dummy pixel array in accordance with an embodiment of the present invention.
Figure 7:
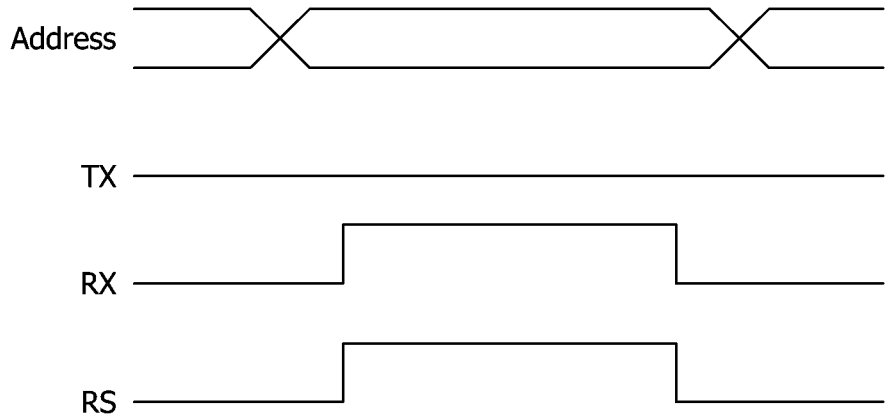

FIG. 7 is a timing diagram illustrating the operation of the unit pixel of the dummy pixel array in accordance with the embodiment of the present invention.

FIG. 7(a) is a timing diagram of the unit pixel in the precharge period when writing a '1'. In the precharge period, the power supply voltage VDDA is applied to the gate terminal TX of the transfer transistor 410, and the ground voltage AGND is applied to the gate terminal RX of the reset transistor 420. In addition, in this period, the ground voltage AGND is applied to the gate terminal RS of the select transistor 440.

FIG. 7(b) is a timing diagram of the unit pixel in the read period. In the read period, the ground voltage AGND is applied to the gate terminal TX of the transfer transistor 410, and the power supply voltage VDDA is applied to the gate terminal RX of the reset transistor 420. In addition, in this period, the power supply voltage VDDA is applied to the gate terminal RS of the select transistor 440.

Figure 8:
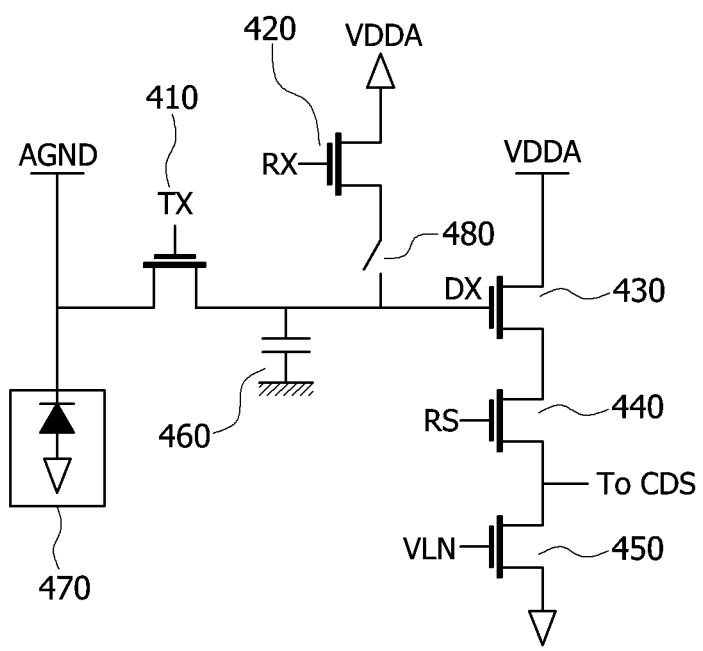
FIG. 8 is a configuration diagram illustrating a unit pixel of a dummy pixel array in accordance with another embodiment of the present invention.

FIG. 8 is a configuration diagram illustrating a unit pixel of a dummy pixel array in accordance with another embodiment of the present invention.

As illustrated in FIG. 8, the ground voltage AGND instead of the power supply voltage VDDA may be supplied to one terminal of the transfer transistor 410, and the power supply voltage VDDA instead of the ground voltage AGND may be supplied to one terminal of the reset transistor 420. In this case, in the precharge period, the ground voltage AGND is charged in the floating node 460. When the switch 480 is closed in the read period, the drive transistor 430 transfers the power supply voltage VDDA. When the switch 480 is opened, the drive transistor 430 transfers the ground voltage AGND.

As described above, the unit pixel of the dummy pixel array further includes one switch, and appropriate voltages (for example, the power supply voltage or the ground voltage) are supplied to one terminal of the transfer transistor and the one terminal of the reset transistor. In the precharge period and the read period, appropriate voltages (for example, the power supply voltage or the ground voltage) are supplied to the gate terminal of the transfer transistor and the gate terminal of the reset transistor. In this manner, data "0" or data "1" can be read through the drive transistor.

Since the digital value required for the operation of the CMOS image sensor is stored in the dummy pixel array, it is possible to provide the CMOS image sensor which is more highly integrated and operated effectively.

Although the exemplary CMOS transistors have been described above, the invention can also be applied to various types of image sensors.

In accordance with the embodiments of the present invention, since the digital codes required for the operation of the image sensor can be stored in the dummy cell array which is manufactured together during the fabrication of the pixel array of the CMOS image sensor, it is unnecessary to implement an additional mask ROM required for the operation of the CMOS image sensor.

While the present invention has been described with respect to the specific embodiments, it will be apparent to those skilled in the art that various changes and modifications may be made without departing from the spirit and scope of the invention as defined in the following claims.

What is claimed is:

1. A dummy pixel in an image sensor configured as a memory cell, comprising:
    a first transistor having a first terminal receiving a first voltage and a second terminal coupled to a floating node;
    a second transistor having a first terminal receiving a second voltage and a second terminal, which is selectively coupled to the floating node, and resetting the floating node;
    a switch disposed between the second terminal of the second transistor and the floating node, and selectively switching the coupling between the second terminal, the second transistor, and the floating node;
    a driving transistor configured to drive a voltage at its first terminal to its second terminal according to a voltage level applied to the floating node; and
    a select transistor configured to communicate the voltage at the second terminal of the driving transistor as an output of the dummy pixel.

2. The dummy pixel of claim 1, wherein a "1" or a "0" is stored in the dummy pixel by controlling the switch.

3. The dummy pixel of claim 1, further comprising a photodiode coupled to the first terminal of the first switch.

4. The dummy pixel of claim 1, wherein the first voltage is a voltage which turns on the driving transistor so that a voltage applied to a second terminal of the driving transistor is transferred to the first terminal of the driving transistor.

5. The dummy pixel of claim 4, wherein the first voltage is a power supply voltage, and the second voltage is a ground voltage.

6. The dummy pixel of claim 1, wherein the first voltage is a voltage which does not turn on the driving transistor.

7. The dummy pixel of claim 6, wherein the first voltage is a ground voltage, and the second voltage is a power supply voltage.

8. The dummy pixel of claim 1, wherein the dummy pixel is configured in a 4 T pixel structure.

* * * * *